United States Patent [19]

Hasircoglu

[11] Patent Number: 4,902,236
[45] Date of Patent: Feb. 20, 1990

[54] FLEX CIRCUIT AND CABLE ASSEMBLY

[75] Inventor: Alexander W. Hasircoglu, Lancaster, Pa.

[73] Assignee: E. I. Du Pont De Nemours and Company, Wilmington, Del.

[21] Appl. No.: 271,153

[22] Filed: Nov. 14, 1988

[51] Int. Cl.[4] ............................................. H01R 9/09
[52] U.S. Cl. ....................................... 439/77; 439/67; 439/493; 439/497
[58] Field of Search ................... 439/67, 77, 493, 494, 439/497

[56] References Cited

U.S. PATENT DOCUMENTS

| | | | |
|---|---|---|---|
| 3,069,753 | 12/1962 | Lalmond et al. | 439/77 |
| 3,696,319 | 10/1972 | Olsson | 339/17 F |
| 3,727,168 | 4/1973 | Henschen et al. | 339/17 F |
| 3,923,364 | 12/1975 | Shapiro et al. | 339/176 MF |
| 4,548,452 | 10/1985 | Gillett | 339/17 R |
| 4,639,063 | 1/1987 | Mueller | 439/77 |

OTHER PUBLICATIONS

DuPont Electronics Interconnect and Packaging Products Catalog 88-A, "SLT Transmission Line Cable Assemblies", pp. 418–420 (1988).

Primary Examiner—P. Austin Bradley

[57] ABSTRACT

A flex circuit and cable assembly for interconnecting printed circuit boards includes a flexible insulating substrate having a conductive ground plane formed on one side and first and second sets of longitudinally extending and interdigitated conductive traces on the other side. The traces of the first and second sets alternate with and are laterally spaced from one another and are provided with an array of connection pads formed on the conductive traces for connection to the tails of an electrical connector or header. Each connection array is defined by a first set of laterally enlarged connection pads associated with each conductive trace of the first set of conductive traces and formed along a first lateral axis and by a second set of laterally enlarged connection pads associated with each conductive trace of the second set of conductive traces and formed along a second lateral axis that is longitudinally spaced from the first lateral axis. An electrical connector or header having first and second sets of contacts is assembled to the connection array by folding the flex circuit about a fold axis intermediate the two lateral axes and connecting the tail portions of the first set of electrical contacts to the connection pads of the first set of traces and the tails of the second set electrical contact the connection pads of the second set of traces.

14 Claims, 2 Drawing Sheets

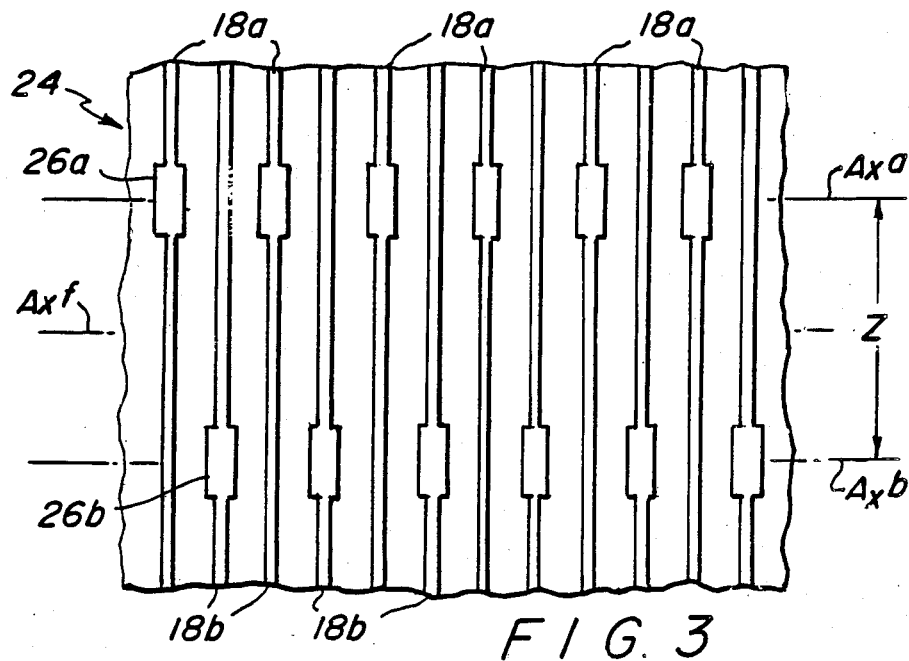
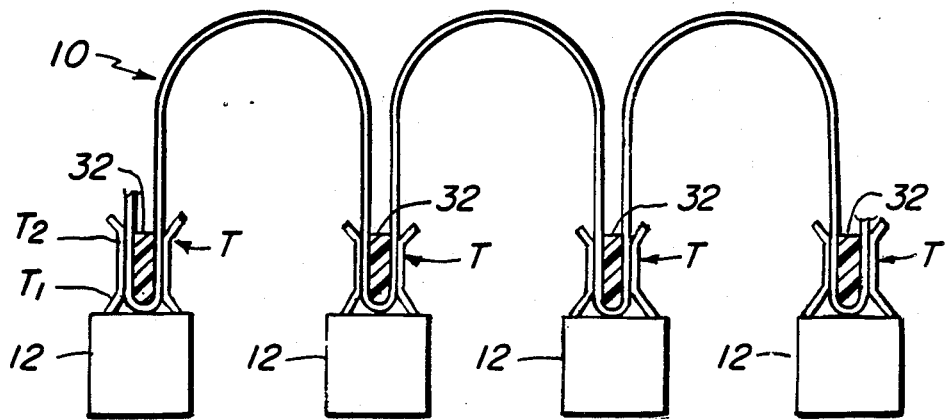

though any penetration of the ground plane or the conductive trace establishes a two-dimensional discontinuity that alters the characteristics of the connection path and the shielding effect offered by the ground plane. Thus, the closely adjacent conductive traces in the flex circuit can provide different impedances, including resistive, capacitive, and inductive constituents, for the various signal-carrying circuits as a function of the two-dimensional discontinuities caused by the various holes. In addition, the presence of a hole in the conductor trace requires an enlargement of the conductive trace in the vicinity of the hole to provide an adequate solderable surface for connection to the tail portion of the respective contact. While this type of conductive trace arrangement does not cause signal transmission degradation at DC and at relatively low-frequencies, the presence of the discontinuities in either or both the signal carrying conductive traces and the ground plane can cause signal degradation at relatively high digital speeds, especially where the interconnects are part of a digital bus application in which all pulses must travel in a synchronous or quasi-synchronous manner with minimal relative degradation because of the impedance characteristics of the flexible circuit.

FLEX CIRCUIT AND CABLE ASSEMBLY

BACKGROUND OF THE INVENTION

The present invention relates to electrical cable assemblies and, more particularly, to flex circuits connected to a series of connectors in which intercircuit cross-talk is minimized and in which impedance changes within each circuit path are likewise minimized.

In electronic systems that use printed circuit boards, one of the trends is to provide a series of printed circuit boards that communicate with one another along a multi-circuit bus via edge-mounted headers. In one type of design, the printed circuit boards are interconnected via a backplane or motherboard which carries connectors that receive the edge-mounted headers of each printed circuit board and effects interconnection via printed conductor traces on the motherboard. In other systems, cable assemblies are used to interconnect the printed circuit boards. These cable assemblies include multi-contact connectors at the opposite ends of the cable as well as one or more similar connectors positioned along the cable at intermediate positions. In general, each circuit path in the cable connects like contacts in each of the connectors.

While discrete wire bundles and flat-conductor cables have been used in the cable assemblies, one trend is to use flex circuits to interconnect the various contacts in the connectors. In one form, the flex circuit typically includes a flexible polyimide substrate having a plurality of printed conductive traces on one side with a polyimide insulating cover providing a complete assembly. In this flex circuit arrangement, every other conductive trace carries a signal with the alternate conductive traces connected to ground so that every signal path is bounded on opposite sides by a ground path to minimize cross-talk. The spacing between the signal carrying path and its adjacent ground conductors is critical and small dimensional changes can adversely affect cross-talk. In another type of flex circuit, the flexible polyimide substrate includes a plurality of printed conductive traces on one side and a continuous conductive ground plane on the other side with polyimide insulating covers on opposite sides of the conductive trace, substrate, and ground plane laminae to provide a complete cable structure. When the spacing between the conductive traces on the one side of the substrate and the ground plane is less than the spacing between the conductive traces on the other side of the substrate, cross-talk is a function only of the spacing between the ground plane and the conductive traces, this spacing being only the thickness of the substrate upon which the conductive traces and the ground plane are mounted.

The latter flex circuit configuration offers increased signal carrying capacity over the former configuration, since each conductive trace carries a signal. In general, electrical connection between the conductive traces and the connectors for the latter flex circuit configuration is effected by removing a portion of the insulating cover and the ground plane and forming a hole in the substrate and conductor path through which hole the tail portion of the respective contact in the connector housing is passed to effect an electrical connection. This connection arrangement is generally satisfactory, although any penetration of the ground plane or the conductive trace establishes a two-dimensional discontinuity that alters the characteristics of the connection path

SUMMARY OF THE INVENTION

In view of the above, it is an object of the present invention, among others, to provide a flex circuit and cable assembly for interconnecting circuits between printed circuit boards.

It is another object of the present invention to provide a flex circuit and cable assembly which conveniently and reliably interconnects a header or connector to a flex circuit to form a cable assembly.

It is another object of the present invention to provide a flex circuit and cable assembly suitable for high-speed digital cable assemblies.

It is another object of the present invention to provide a flex circuit and cable assembly in which impedance variations, physical discontinuities, and cross-talk are minimized.

In view of these objects, and others, the present invention provides a flex circuit and cable assembly in which a flexible insulating substrate is provided with a conductive ground plane formed on one side thereof and first and second sets of longitudinally extending and interdigitated conductive traces on the other side. The traces of the first and second sets alternate with and are laterally spaced from one another and are provided with an array of connection pads formed on the conductive traces for connection to the tails of an electrical connector or header. Each connection array is defined by a first set of laterally enlarged connection pads associated with each conductive trace of the first set of conductive traces and formed along a first lateral axis and by a second set of laterally enlarged connection pads associated with each conductive trace of the second set of conductive traces and formed along a second lateral axis that is longitudinally spaced from the first lateral axis. An electrical connector or header having first and second sets of electrical contacts is assembled to the connection array by connecting the tail portions of the first set of electrical contacts to the connection pads of the first set of traces and the tails of the second set electrical contacts to the connection pads of the second set of traces. In the preferred embodiment, a spacer strip maintains the flex circuit in a folded state at the contact array.

The present invention advantageously provides a flex circuit and cable assembly in which a flex circuit and a header or connector are connected in a space and cost efficient manner to fabricate a cable assembly in which impedance discontinuities and cross-talk are desirably minimized.

Other objects and further scope of applicability of the present invention will become apparent from the detailed description to follow, taken in conjunction with the accompanying drawings, in which like parts are designated by like reference characters.

BRIEF DESCRIPTION OF THE DRAWING

FIG. 2 is a representative side view, in cross-section, of the structure of the flex circuit of FIG. 1;

FIG. 3 is a plan view of a portion of the flex circuit of FIG. 1 illustrating an exemplary connection pad array; and FIG. 4 is an end view of a three-connector cable assembly in accordance with the present invention.

DESCRIPTION OF THE PREFERRED EMBODIMENT

Figure 1:
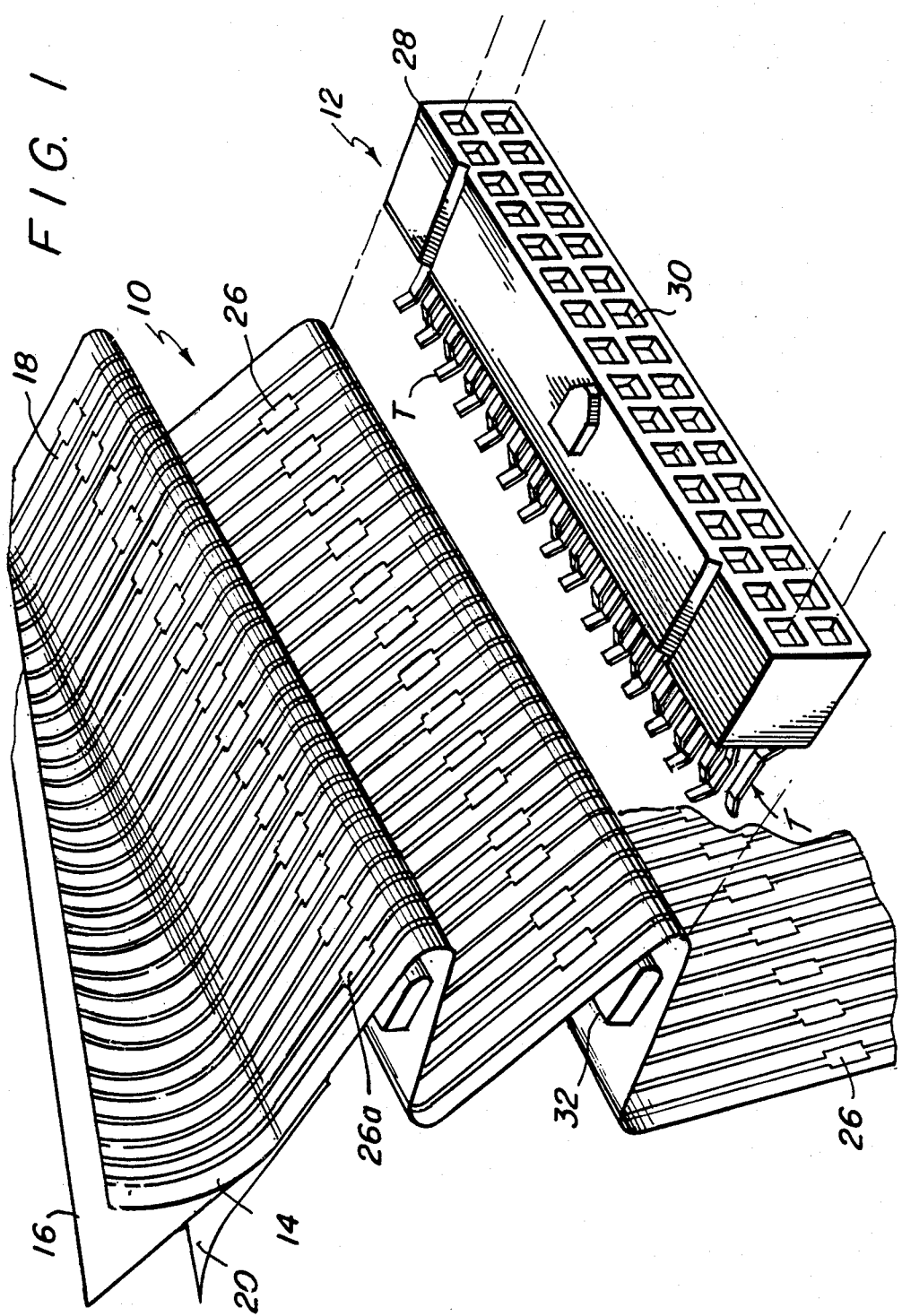
FIG. 1 is an exploded perspective view of a section of a flex circuit and a representative connector.

A preferred embodiment of the present invention is shown in exploded perspective in FIG. 1 and includes a flex circuit, designated generally by the reference character 10, and an exemplary header 12. As shown in the cross-sectional view of FIG. 2, the flex circuit 10 is fabricated from a flexible polyimide substrate 14 having a solid conductive ground plane 16 positioned on one side thereof and a plurality of laterally spaced conductive traces 18 on the other side. The ground plane 16 and the conductive traces 18 may be formed from copper by conventional plating/etching techniques as is known in the art. A first cover sheet 20 is laminated to the ground plane side of the substrate 14 and, in a similar manner, another cover sheet 22 (illustrated in FIG. 2 only) is laminated to the conductive trace side of the substrate 14 with the opposite lateral margins (unnumbered) of the cover sheets 20 and 22 extending beyond the edges of the substrate 14 to provide a fully assembled and insulated flex circuit 10.

As shown in FIGS. 1 and 3, the flex circuit 10 is provided with an array, generally indicated at 24, of connection pads 26 for each header 12 to be assembled to the flex circuit 10. In a typical installation, a flex circuit 10 is provided with an array 24 of connection pads 26 at or adjacent each end of the flex circuit 10 and one or more arrays 24 at positions intermediate the ends thereof as represented in end view in FIG. 4. As best shown in FIG. 3, the conductive traces 18 are divided into two sets, 18a and 18b, of traces 18 that are alternated or interdigitated with one another, e.g., conductive traces 18a are in an alternating relationship relative to and are interdigitated with regard to the conductive traces 18b. As shown, laterally enlarged connection pads 26a are provided for each of the conductive traces 18a in the first set and are aligned along a laterally aligned axis $A_xa$, and, in a similar manner, laterally enlarged connection pads 26b are provide for each of the conductive traces 18b in the second set and are aligned along another laterally aligned axis $A_xb$. The axes $A_xa$ and $A_xb$ are spaced longitudinally from one another by a selected distance Z. In the preferred embodiment, the conductive traces 18 are positioned on 0.050 inches (1.27 mm.) centers and have a typical conductor width of between 0.015 and 0.020 inches, depending upon the desired signal impedance. The connection pads 26 in each set are accordingly on 0.100 centers and have a 0.040 inches lateral dimension so that a conductive trace 18 of one set of conductive traces 18 can pass between two adjacent connection pads 26 of the other set.

The headers 12 are preferably SLT-type headers sold by DuPont Electronics of New Cumberland, Pa. 17070, these headers having two rows of twelve receptacle-type electrical contacts arranged in a rectangular matrix. As shown in FIG. 1, each header 12 includes a molded plastic housing 28 having a plurality of through openings 30 arranged in two parallel rows on its forward end with receptacles (not shown) contained within each opening and with respective tails T extending rearwardly of the housing 28. As shown in FIG. 4, each tail T includes first and second portions $T_1$ and $T_2$ that define a contact area (unnumbered) therebetween. As shown in FIG. 1, the through openings 30 of the upper row are superposed directly above the openings of the lower row in accordance with the rectangular matrix configuration. The upper row of tails T are laterally offset or spaced from the lower row of tails T so that each tail is pre-positioned for eventual connection of a connection pad 26. For example and in the context of FIG. 1, the tails T of the lower row are offset to the left of the longitudinal axis of the respective through opening 30, and the tails T of the upper row are offset to the right of the longitudinal axis of the respective through opening 30. In general, the offset distance from the longitudinal axis of the respective through opening 30 is one-half the lateral trace-to-trace spacing.

A header 12 is assembled to the flex circuit 10 by first folding the flex circuit 10 along a fold axis $A_xf$ that is intermediate the first and second lateral axes $A_xa$ and $A_xb$ so that the connection pads 26a and 26b face outwardly as shown in FIG. 1. A strip-like spacer 32 is inserted between the folded sections of the flex circuit 10 adjacent the fold axis $A_xf$. The spacer 32 is preferably fabricated from a molded plastic or a phenolic material and has a lateral width at least co-extensive with that of the flex circuit 10. If desired, the edge of the spacer 32 that is positioned at or against the folded flex circuit 10 can be radiused. The folded flex circuit 10 and its spacer 32 are then inserted between the opposed tails T of the header 12 so that each tail T is positioned upon and in engagement with its respective connection pad 26a or 26b. The upper row of tails T engages the connection pads 26a, and the lower row of tails T engages the connection pads 26b. Thereafter, the tail-to-pad connection is soldered to provide a permanent electrical and mechanical connection.

As represented in FIG. 4, the flex circuit 10 and the assembled headers 12 permit convenient and electrically efficient fabrication of cable assemblies having a header 12 on both ends as well as one or more headers 12 at intermediate positions, such cables assemblies being well suited to connecting groups of printed circuit boards.

As will be apparent to those skilled in the art, various changes and modifications may be made to the illustrated flex circuit and cable assembly of the present invention without departing from the spirit and scope of the invention as determined in the appended claims and their legal equivalent.

What is claimed is:

1. A flex circuit cable assembly comprising:
   a flex circuit including a flexible insulating substrate having a conductive ground plane formed on one side thereof and first and second sets of longitudinally extending conductive traces on the other side thereof, the traces of said first and second sets alternating with and laterally spaced from one another, an array of connection pads formed on the conductive trace for connection to an electrical connector, said array defined by a first set of laterally enlarged connection pads associated with each conductive trace of the first set of conductive traces and formed along a first lateral axis and defined by a second set of laterally enlarged connection pads associated with each conductive trace of the second set of conductive traces and formed along a second lateral axis longitudinally spaced from the first lateral axis said flex circuit being folded about a fold axis intermediate each of said first and second lateral axes; and an electrical connector having a housing and first and second sets of electrical contacts therein, the contacts having respective tails extending from the housing, the tails of the first set electrically connected to the connection pads of the first set of traces and the tails of the second set electrically connected to the connection pads of the second set of traces.

2. The flex circuit cable assembly of claim 1, further comprising:
at least one other array of connection pads spaced from said first array.

3. The flex circuit cable assembly of claim 1, further comprising:
an array of connection pads at opposite ends of said flex circuit, said first array intermediate the opposite ends of said flex circuit.

4. The flex circuit cable assembly of claim 4, further comprising:
a spacer strip between the folded portions of the flex circuit.

5. The flex circuit cable assembly of claim 4, wherein the first and second lateral axes of the array are spaced a selected distance Z from one another, the flex circuit folded along an laterally extending fold axis located a distance of Z/2 between the first and second lateral axes.

6. The flex circuit cable assembly of claim 5, wherein the connection pads of each set extend laterally a selected distance on each side the respective conductive trace.

7. The flex circuit cable assembly of claim 6, wherein the connection pads are spaced at twice the distance of the conductive traces.

8. A flex circuit cable comprising:
a flex circuit including a flexible insulating substrate having a conductive ground plane formed on one side thereof and first and second sets of longitudinally extending conductive traces on the other side thereof, the traces of said first and second sets alternating with and laterally spaced from one another, an array of correction pads formed on the conductive traces for connection to an electrical connection, said array defined by a first set of laterally enlarged connection pads associated with each conductive trace of the first set of conductive traces and formed along a first lateral axis and defined by a second set of laterally enlarged connection pads associated with each conductive trace of the second set of conductive traces and formed along a second lateral axis longitudinally spaced from the first lateral axis, said flex circuit being folded about a fold axis intermediate each of said first and second lateral axes.

9. The flex circuit cable assembly of claim 8, further comprising:
at least one other array of connection pads spaced from said first array.

10. The flex circuit cable assembly of claim 8, further comprising:
an array of connection pads at opposite ends of said flex circuit, said first array intermediate the opposite ends of said flex circuit.

11. The flex circuit cable assembly of claim 8, further comprising:
a spacer strip between the folded portions of the flex circuit.

12. The flex circuit cable assembly of claim 8, wherein the first and second lateral axes of the array are spaced a selected distance Z from one another, the flex circuit folded along an laterally extending fold axis located a distance of Z/2 between the first and second lateral axes.

13. The flex circuit cable assembly of claim 8, wherein the connection pads of each set extend laterally a selected distance on each side its conductive trace.

14. The flex circuit cable assembly of claim 13, wherein the conductive traces are spaced at half the distance of the connection pads.

* * * * *